United States Patent
Sugino et al.

(10) Patent No.: US 9,252,026 B2
(45) Date of Patent: Feb. 2, 2016

(54) BURIED TRENCH ISOLATION IN INTEGRATED CIRCUITS

(71) Applicant: Spansion LLC, Sunnyvale, CA (US)

(72) Inventors: Rinji Sugino, San Jose, CA (US); Lei Xue, Saratoga, CA (US); Ching-Huang Lu, Fremont, CA (US); Simon Chan, Saratoga, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/207,303

(22) Filed: Mar. 12, 2014

(65) Prior Publication Data

US 2015/0262838 A1    Sep. 17, 2015

(51) Int. Cl.
*H01L 21/76* (2006.01)
*H01L 21/324* (2006.01)
*H01L 21/764* (2006.01)
*H01L 21/762* (2006.01)
*H01L 29/06* (2006.01)

(52) U.S. Cl.
CPC .......... *H01L 21/3247* (2013.01); *H01L 21/764* (2013.01); *H01L 21/76224* (2013.01); *H01L 29/0649* (2013.01)

(58) Field of Classification Search
CPC ..................... H01L 21/3247; H01L 21/76224; H01L 21/76248
USPC .......................................................... 438/411
See application file for complete search history.

(56) References Cited

U.S. PATENT DOCUMENTS

| | | | |
|---|---|---|---|
| 7,009,273 B2 | 3/2006 | Inoh et al. | |
| 7,019,364 B1 * | 3/2006 | Sato et al. | 257/347 |
| 7,019,365 B2 | 3/2006 | Sato et al. | |
| 7,145,215 B2 | 12/2006 | Inoh et al. | |
| 7,235,456 B2 | 6/2007 | Sato et al. | |
| 7,372,086 B2 | 5/2008 | Sato et al. | |
| 7,420,249 B2 | 9/2008 | Sato et al. | |
| 7,507,634 B2 | 3/2009 | Sato et al. | |
| 2011/0127650 A1 * | 6/2011 | Witvrouw et al. | 257/622 |
| 2014/0011334 A1 * | 1/2014 | Cho et al. | 438/253 |

OTHER PUBLICATIONS

Sato, T., et al., "SON (Silicon on Nothing) MOSFET using ESS (Empty Space in Silicon) technique for SoC applications," *Electron Devices Meeting, 2001. IEDM '01. Technical Digest. International*, IEEE, United States (2001).

* cited by examiner

*Primary Examiner* — Bradley K Smith

(57) ABSTRACT

A system and method for providing electrical isolation between closely spaced devices in a high density integrated circuit (IC) are disclosed herein. An integrated circuit (IC) comprising a substrate, a first device, a second device, and a buried trench in the substrate and a method of fabricating the same are also discussed. The buried trench is positioned between first and second devices and may be filled with dielectric material. Alternatively, the buried trench contains air. A method of using Hydrogen annealing to create the buried trench is disclosed.

20 Claims, 9 Drawing Sheets

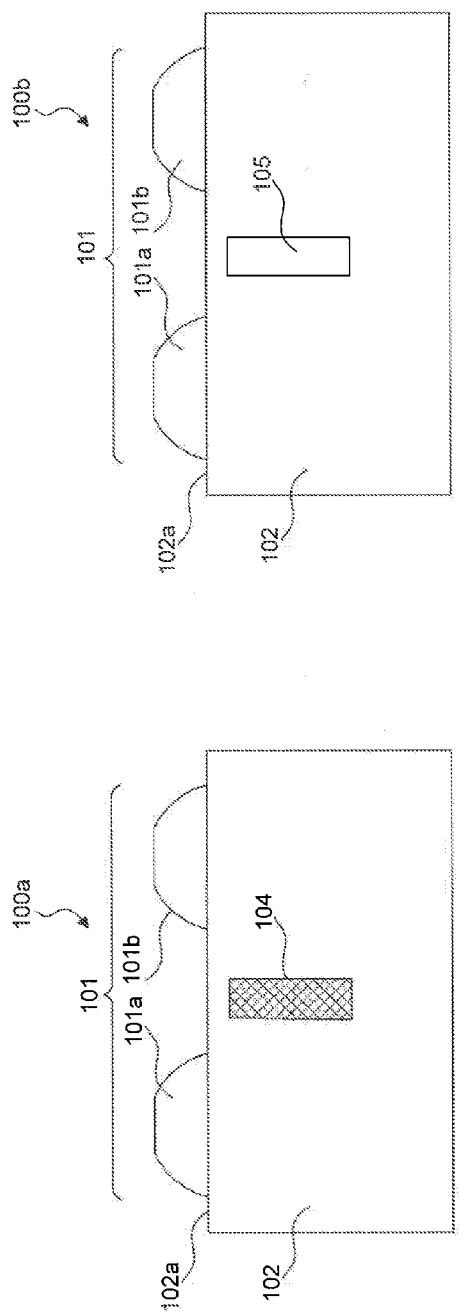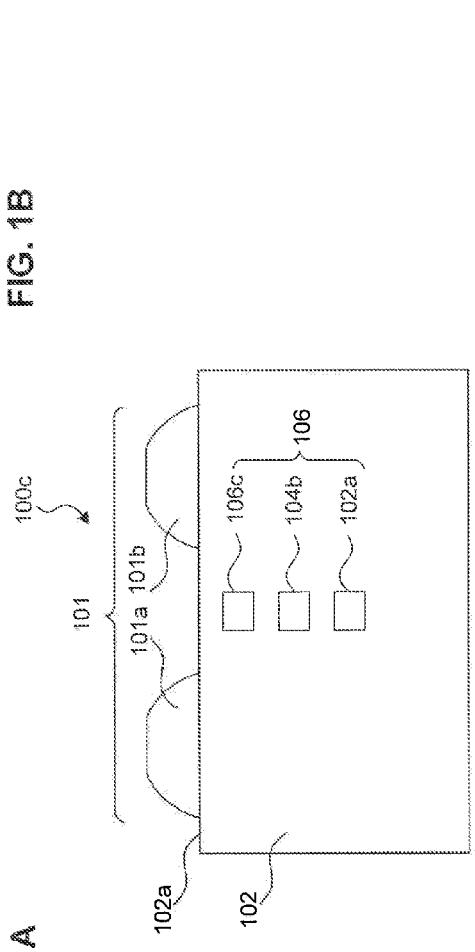

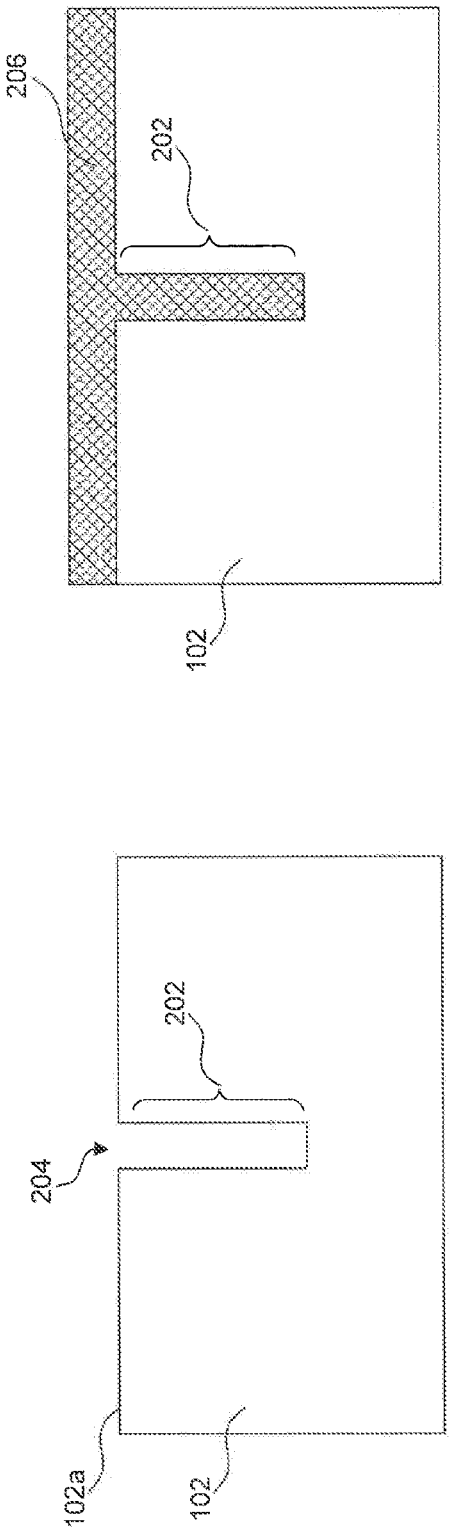
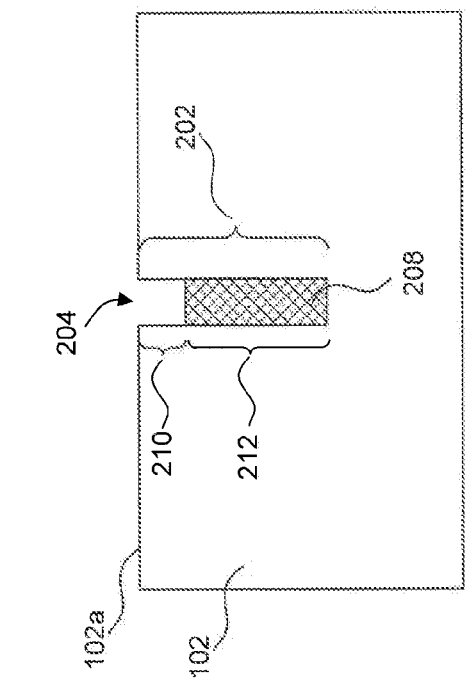
FIG. 2A
FIG. 2B
FIG. 2C

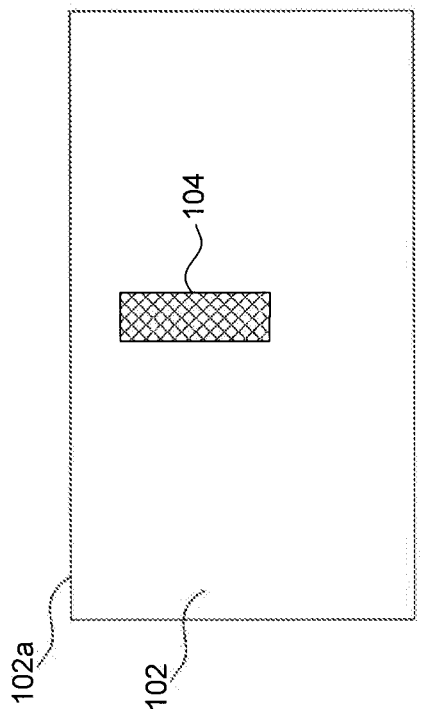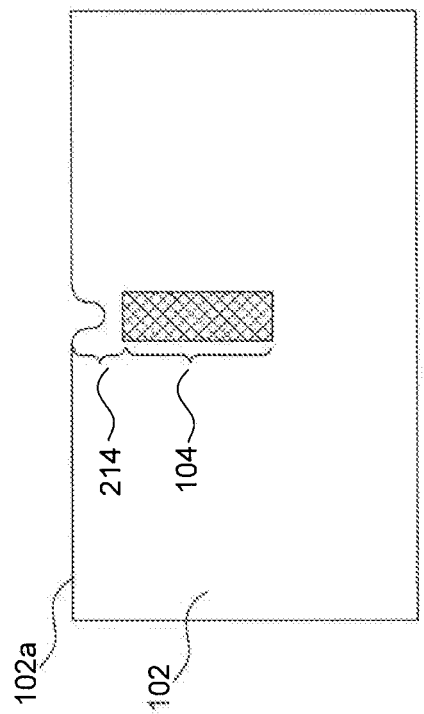

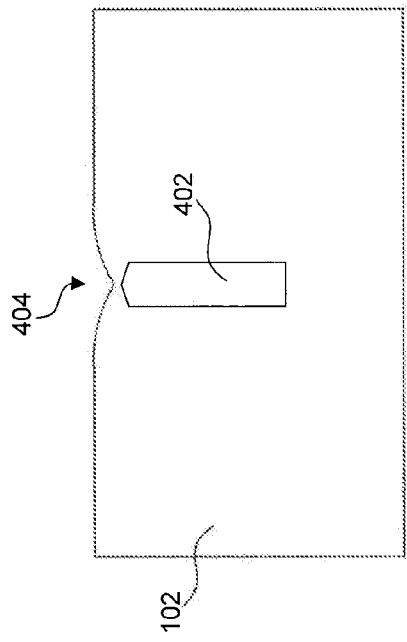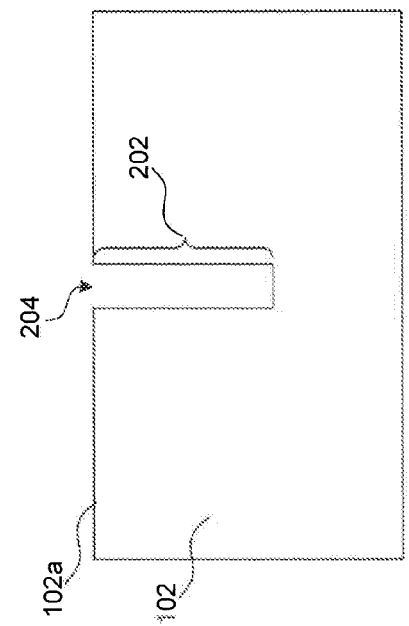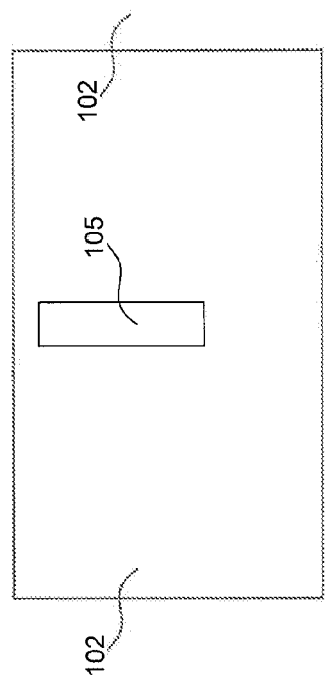

BURIED TRENCH ISOLATION IN INTEGRATED CIRCUITS

CROSS REFERENCE TO RELATED APPLICATIONS

The present application is related to U.S. application Ser. Nos. 14/048,527 and 14/048,863, which are hereby incorporated by reference in their entireties.

BACKGROUND

1. Field

The present application relates to the fabrication of trenches buried in substrates of integrated circuits.

2. Background

With the advances in semiconductor technology, there has been increasing demand for higher storage capacity, faster processing systems, and high speed communication systems. To meet these demands, the semiconductor industry continues to scale down dimension of devices, and also increase packing density of devices on an integrated circuit (IC) to accommodate a larger number of devices on an IC. However, scaling down of devices to smaller dimensions can introduce short channel effects in the devices due to the short channel lengths (about approximately 100 nm or less) of the scaled down devices. In addition, closely spaced devices may suffer from disturbances such as electron leakage, noise coupling, or electrostatic coupling. These drawbacks can degrade the operating characteristics and performance of the devices over time. Thus, it is desirable to improve performance of devices in such high density ICs.

SUMMARY

According to an embodiment, an IC includes a substrate, a first device and a second device, that may exist next to each other, and are formed on a surface of the substrate. Each of the first and the second devices include a gate structure. The IC further includes an isolator formed within the substrate and positioned space-wise between the first and the second device. The isolator includes one or more cavities buried under the substrate to isolate the two devices. In an embodiment the one or more cavities comprises one cavity and the one cavity is filled with a dielectric material.

According to another embodiment, a method for fabricating an integrated circuit (IC) is provided. The method includes forming a trench in a substrate. The trench having a closed end within the substrate and an open end adjacent a surface of the substrate. The method further includes initiating a reshaping of portion of the substrate surrounding the open end of the trench. The method further includes closing the open end of the trench with substrate martial to form an isolation region within the substrate. The method further includes creating first and second devices on the surface of the substrate on opposite sides of the isolation region.

According to another embodiment, a method for fabricating an IC is provided. The method includes forming a trench in a substrate. The method further includes depositing dielectric material in the trench such that the layer of dielectric material substantially fills the trench. The method further includes removing the dielectric material from a top portion of the trench. The method further includes closing the open end of the trench such that the substrate material fills the top portion of the trench.

Further features and advantages of the present disclosure, as well as the structure and operation of various embodiments of the present disclosure, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings illustrate the present disclosure and, together with the description, further serve to explain the principles of the disclosure and to enable one skilled in the pertinent art to make and use the disclosure.

FIGS. 1A-1C each illustrate a cross-sectional view of an IC, according to an embodiment.

FIGS. 2A-2E illustrates a cross-sectional view of an IC including a buried trench at select stages of its fabrication process, according to an embodiment.

FIGS. 4A-4C illustrates a cross-sectional view of an IC including a including a buried trench at select stages of its fabrication process, according to an embodiment.

Figure 3A:
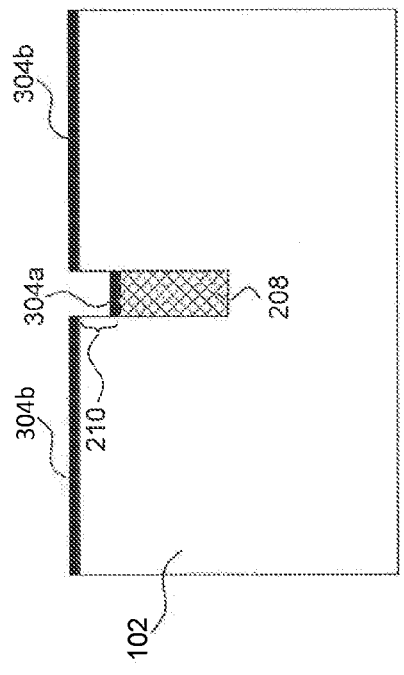
FIGS. 3A-3C illustrates a cross-sectional view of an IC including a buried trench at select stages of its fabrication process, according to an embodiment.

The present disclosure will now be described with reference to the accompanying drawings. In the drawings, like reference numbers generally indicate identical or similar elements. Additionally, generally, the left-most digit(s) of a reference number identifies the drawing in which the reference number first appears.

DETAILED DESCRIPTION

The following Detailed Description refers to accompanying drawings to illustrate embodiments consistent with the disclosure. The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

The embodiments described herein are provided for illustrative purposes, and are not limiting. Other embodiments are possible, and modifications may be made to the embodiments within the spirit and scope of the disclosure. Therefore, the Detailed Description is not meant to limit the present disclosure. Rather, the scope of the present disclosure is defined only in accordance with the following claims and their equivalents.

The following Detailed Description of the embodiments will so fully reveal the general nature of the present disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Those skilled in the relevant art(s) will recognize that this description may be applicable to many various semiconductor devices, and should not be limited to any particular type of semiconductor devices. Before describing the various embodiments in more detail, further explanation shall be given regarding certain terms that may be used throughout the descriptions.

In embodiments, the term "etch" or "etching" or "etchback" generally describes a fabrication process of patterning a material, such that at least a portion of the material remains after the etch is completed. For example, generally the process of etching a semiconductor material involves the steps of patterning a masking layer (e.g., photoresist or a hard mask) over the semiconductor material, subsequently removing areas of the semiconductor material that are no longer protected by the mask layer, and optionally removing remaining portions of the mask layer. Generally, the removing step is conducted using an "etchant" that has a "selectivity" that is higher to the semiconductor material than to the mask layer. As such, the areas of semiconductor material protected by the mask would remain after the etch process is complete. However, the above is provided for purposes of illustration, and is not limiting. In, another example, etching may also refer to a process that does not use a mask, but still leaves behind at least a portion of the material after the etch process is complete.

The above description serves to distinguish the term "etching" from "removing." In an embodiment, when etching a material, at least a portion of the material remains behind after the process is completed. In contrast, when removing a material, substantially all of the material is removed in the process. However, in other embodiments, 'removing' may incorporate etching.

In an embodiment, the terms "deposit" or "dispose" describe the act of applying a layer of material to the substrate. Such terms are meant to describe any possible layer-forming technique including, but not limited to, thermal growth, sputtering, evaporation, chemical vapor deposition, epitaxial growth, atomic layer deposition, electroplating, etc.

In an embodiment, the term "substrate" describes a material onto which subsequent material layers are added. In embodiments, the substrate itself may be patterned and materials added on top of it may also be patterned, or may remain without patterning. Furthermore, "substrate" may be any of a wide array of semiconductor materials such as silicon, germanium, gallium arsenide, indium phosphide, etc. In other embodiments, the substrate may be electrically non-conductive such as a glass or sapphire wafer.

In an embodiment, the term "substantially perpendicular," in reference to a topographical feature's sidewall, generally describes a sidewall disposed at an angle ranging between about 85 degrees and 90 degrees with respect to the substrate.

In an embodiment, the term "substantially in contact" means the elements or structures in substantial contact can be in physical contact with each other with only a slight separation from each other.

In an embodiment, devices fabricated in and/or on the substrate may be in several regions of the substrate, and these regions may not be mutually exclusive. That is, in some embodiments, portions of one or more regions may overlap.

An Integrated Circuit According to a First Embodiment

FIG. 1A illustrates a cross-sectional view of an IC 100a according to an embodiment. In one example, IC 100a may include a substrate 102, one or more devices 101, and a trench 104 (e.g., a buried trench). Devices 101 as shown in FIG. 1 include only two devices 101a and 101b for the sake of simplicity. However, as would be understood by a person of skilled in the art based on the description herein, devices 101 may include any number of devices.

Substrate 102 may be a silicon (Si) substrate implanted with p-type carriers to be a p-type Si substrate, according to an example embodiment. The p-type carriers may be provided by p-type materials, such as, but not limited to, boron. Alternatively, substrate 102 may be a p-type well formed in an n-type Si substrate or well (not shown). The N-type Si substrate is formed by implanting n-type carriers that are provided by n-type materials, such as, but not limited to, phosphorus.

In an example, devices 101a and 101b may each represent a field-effect transistor (FET) including doped regions and a gate structure (not shown). Devices 101a and 101b may be similar in structure and function. Alternatively, devices 101a and 101b may be two distinct devices. According to an embodiment, devices 101 may be positioned on a top surface 102a of substrate 102.

In one example, buried trench 104 may be filled with a dielectric material. The dielectric material may be, for example, oxide or nitride.

In accordance with an embodiment, buried trench 104 may be positioned in substrate 102 between devices 101a and 101b. While buried trench 104 is shown in FIG. 1A- to comprise a vertical cross-section having a rectangular perimeter. In alternate embodiments buried trench 104 may comprise vertical cross-sections having any geometric shaped perimeters (e.g., trapezoidal).

Buried trench 104 may run parallel to a bitline or the substrate surface 102, and it may have a greater depth than width, in an embodiment. In an example, buried trench 104 may comprise a vertical dimension of about 100 nm-400 nm and it may be positioned about 100 nm or less under the surface 102a of substrate 102.

During operation of devices 101, electronic processes may be carried out within a region of substrate 102. These electronic processes of device 101a may create disturbances such as, but not limited to, current leakage, noise coupling, or electrostatic coupling that may negatively affect the electronic processes and as a result the performance of adjacent device 101b in instances where devices 101 are closely spaced on substrate 102. In such instances, buried trench 104 may provide electrical isolation between the electronic processes of devices 101a and 101b within substrate 102, according to an embodiment.

It should be noted that IC 100 is shown in FIG. 1A as including only one arrangement of buried trench 104 interposed between adjacent devices 101a and 101b for the sake of simplicity. However, as would be understood by a person of skilled in the art based on the description herein, IC 100 may include any number of such arrangements with devices and buried trenches similar to devices 101 and buried trench 104, respectively. In addition, IC 100 may include other devices and functional units that are not shown for the sake of simplicity.

An Integrated Circuit According to a Second Embodiment

FIG. 1B illustrates a cross-sectional view of an IC 100b according to an embodiment. IC 100b is similar to IC 100a as described above, therefore only differences between IC 100a and 100b are described herein.

IC 100b may include buried trench 105. Buried trench 105 maybe a cavity that is empty, i.e., without any solid material. The buried trench 105 may, for example, contain air.

An Integrated Circuit According to a Third Embodiment

FIG. 1C illustrates a cross-sectional view of an IC 100c according to an embodiment. IC 100c is similar to IC 100a as described above, therefore only differences between IC 100a and 100c are described herein.

In one example, IC 100c may include multiple buried trenches 106. In the example embodiment shown in FIG. 1C, buried trenches 106 includes cavities 106a, 106b, and 106c which are arranged substantially vertically. Buried trenches 106 as shown in FIG. 1C include three cavities for the sake of simplicity. However, as would be understood by a person of skilled in the art based on the description herein, buried trenches 106 may include any number of cavities.

In an embodiment, buried trenches 106 are cavities empty of any solid material. The buried trenches 104 may, for example, contain air.

An Example Method for Fabricating an Integrated Circuit According to a First Embodiment FIGS. 2A-2E illustrate cross-sectional views of partially fabricated IC 100a during formation of buried trench 104, according to an embodiment. For the sake of simplicity, devices 101 are not shown in the figures for illustrating example methods of forming a buried trench. In some embodiments, devices 101 may be fabricated before forming a buried trench. In some other embodiments, devices 101 maybe fabricated after forming a buried trench.

FIG. 2A illustrates a cross-sectional view of a partially fabricated IC 100a after formation of trench 202 in substrate 102. Trench 202 may be formed by any conventional etching methods suitable for etching the material of substrate 102. For example, a dry etch process such as, but not limited to, reactive ion etching (RIE) may be performed to remove the material of substrate 102 for the formation of trench 202. In an embodiment, trench 202 has a closed end within the substrate and an open end 204 adjacent a surface 102a of the substrate 102.

The formation of the buried trench 104 may comprise a filling process followed by an etch-back process. The filling process may be performed by depositing a layer 206 of dielectric material over the partially fabricated IC 100a of FIG. 2A such that at least trench 202 may be filled, as shown in FIG. 2B. The deposition of layer 206 may be performed using any conventional deposition methods suitable for dielectric materials. For example, dielectric materials such as silicon oxide or silicon nitride may be deposited for layer 206 using a chemical vapor deposition (CVD) or an atomic layer deposition (ALD) process. Following the deposition of layer 206, an etch-back process may be performed to remove layer 206 from all areas except for a portion 212, as shown in FIG. 2C.

The formation of filled portion 212 may be followed by initiating a reshaping of portion 210 of the substrate that surrounds the open end 204 of the trench. Initiating the reshaping of portion 210 may include causing the substrate material surrounding portion 210 to flow and cover the dielectric layer in the portion 212 and to create the buried trench 104 as shown in the example embodiment of FIG. 2D. The reshaping process may continue to close the substrate area 214 on top of the buried trench 104. The reshaping of the substrate area 214 may continue until the surface 102a of the substrate 102 is substantially even over the buried trench 104, as shown in example embodiment of FIG. 2E.

In an embodiment, the reshaping of the substrate may include using hydrogen annealing to cause the substrate material to flow. In an embodiment, the hydrogen annealing comprises annealing in temperature range of approximately 600° C. to approximately 1150° C. In an embodiment, the hydrogen annealing comprises annealing in pressure range of approximately 0.1 Pa to approximately 100 kPa.

It should be understood that the various layers illustrated during the example fabrication process of IC 100a are not necessarily drawn to scale. In addition, the above description is meant to provide a general overview of select steps involved in forming IC 100a shown in FIG. 1A and that, in actual practice, more features and/or fabrication steps may be performed additionally or alternatively to that described herein to form IC 100a, as would be understood by one skilled in the art given the description herein.

Figure 3B:
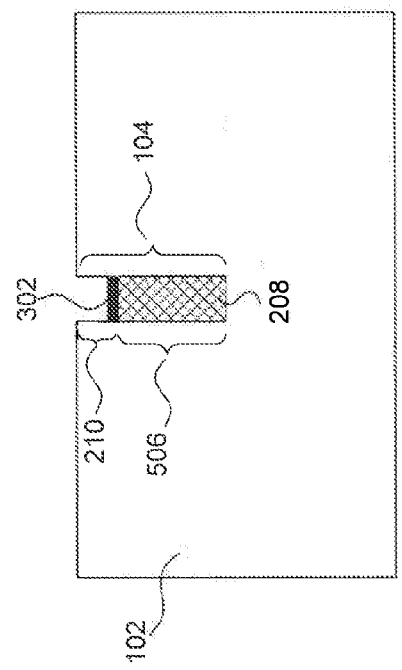
Figure 3C:
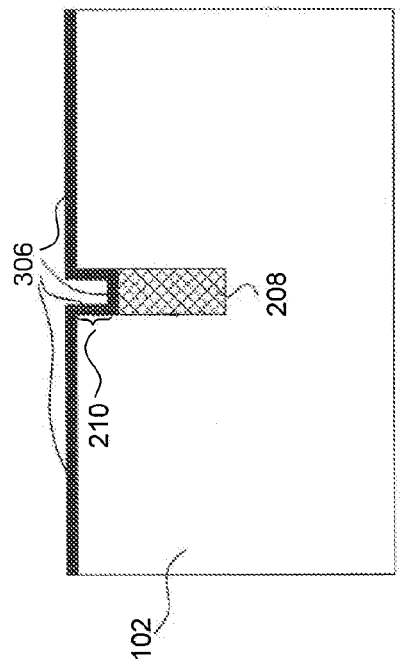

An Example Method for Fabricating an Integrated Circuit According to a Second Embodiment FIGS. 3A-3C illustrate cross-sectional views of partially fabricated IC 100a during formation of buried trench 104, according to an embodiment. According to the embodiment, before initiating the reshaping of the substrate material surrounding portion 210 of the trench 104, a seed layer 302 may be formed on the dielectric layer 208.

In an example, embodiment shown in FIG. 3B, seed layers 304a and 304b are formed before initiating reshaping of the substrate material surrounding portion 210 of the trench 104. Seed layers 304a may be formed on the dielectric layer 208 according to an embodiment. Seed layer 304b may be formed on the surface 102a of substrate 102 outside trench 104.

In an example embodiment shown in FIG. 3C, seed layer 306 may be formed before initiating reshaping of the substrate material surrounding portion 210 of trench 104. Seed layer 306 may be formed such that it covers top of the dielectric layer 208, and sidewall of portion 210 of trench 104 and top surface 102a of substrate 102.

A seed layer may comprise a material that helps smooth reshaping or flow of the substrate material surrounding section 210 and closing of opening 204 of trench 104. A seed layer may comprise materials containing Silicon or Germanium which won't produce dielectric material. In an embodiment, a seed layer comprises same material as the substrate material.

It should be understood that the various layers illustrated during the example fabrication process of IC 100a are not necessarily drawn to scale. In addition, the above description is meant to provide a general overview of select steps involved in forming IC 100a shown in FIG. 1A and that, in actual practice, more features and/or fabrication steps may be performed additionally or alternatively to that described herein to form IC 100a, as would be understood by one skilled in the art given the description herein.

An Example Method for Fabricating an Integrated Circuit According to a Third Embodiment FIGS. 4A-C illustrate an example fabrication process for forming IC 100b shown in FIG. 1B, according to an embodiment. For the sake of simplicity, devices 101 are not shown in the figures for illustrating example methods of forming a buried trench. In some embodiments, devices 101 may be fabricated before forming a buried trench. In some other embodiments, devices 101 maybe fabricated after forming a buried trench.

FIG. 4A illustrates a cross-sectional view of a partially fabricated IC 100*b* after formation of trench 202 in substrate 102. Trench 202 may be formed by methods described with respect to FIG. 2A.

Forming the buried trench 105 may include reshaping portion of the substrate surrounding the open end 204 of the trench 202 in FIG. 2A. Reshaping may include causing the portion of substrate material surrounding the open end 204 of the trench 202 to flow such that the opening 204 is closed. In an embodiment, hydrogen annealing is used to cause the substrate material to flow.

FIG. 4B illustrates cross-sectional views of partially fabricated IC 100*b* during formation of buried trench 105 during an embodiment. After causing the substrate material 404 to flow, the embodiment will close the opening of the trench, such that area 402 is enclosed by substrate material 404.

FIG. 4C illustrates cross-sectional views of partially fabricated IC 100*b* after formation of buried trench 104 during an embodiment.

An Example Method for Fabricating an Integrated Circuit According to a Fourth Embodiment FIGS. 5A-5E illustrate an example fabrication process for forming IC 100*c*, according to an embodiment. In an embodiment, the process shown in FIGS. 5A-5D is used before devices 100 are formed. In another embodiment, the process shown in FIGS. 5A-5D is used after devices 100 are formed.

Figure 5A:
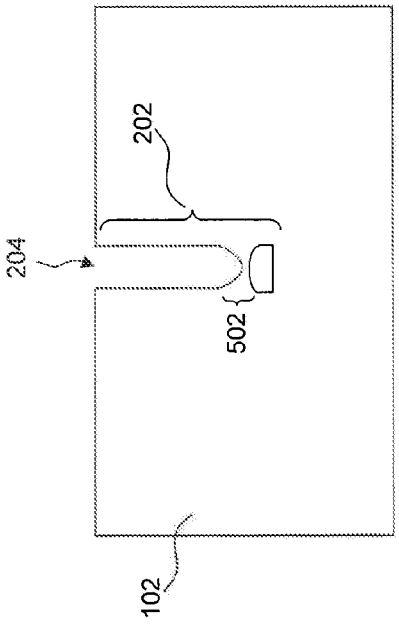
FIGS. 5A-5E illustrate cross-sectional views of an IC including one or more buried trenches at select stages of its fabrication process, according to an embodiment.
Figure 5B:
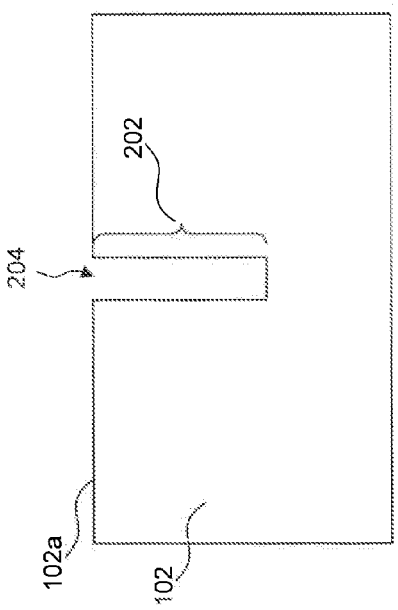

FIG. 5A illustrates a cross-sectional view of a partially fabricated IC 100*c* after formation of trench 202 in substrate 102. Trench 202 may be formed by methods described with respect to FIG. 2A.

Forming the buried trenches 106 may include reshaping portions of the substrate at more than one location along the trench 202 shown in FIG. 5A. Reshaping may include causing the portion of substrate material surrounding a section of the trench 202, for example section 502 shown in FIG. 5B, to flow such that the trench 202 is closed in that portion.

Figure 5C:
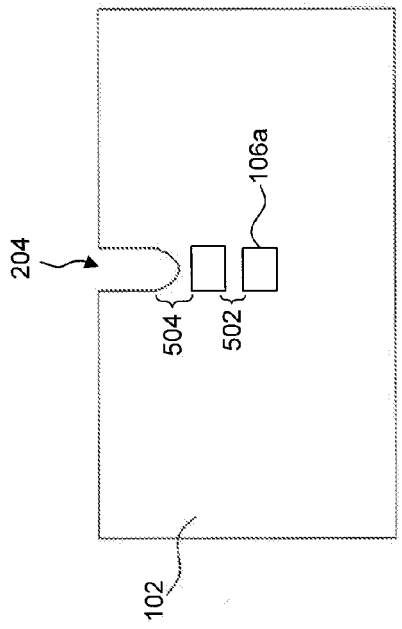
Figure 5E:
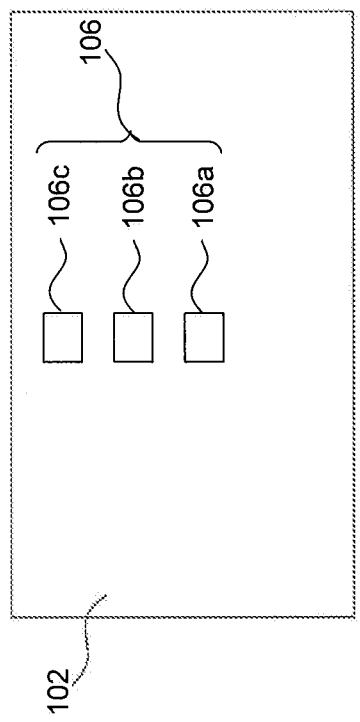

The reshaping of the substrate material surrounding portion 502 of the trench 202 may continue until buried trench 106*a* is formed, as shown, for example, in FIG. 5C. In an embodiment, another buried trench above the buried trench 106*a* may be created by reshaping substrate material for example around portion 504 of the trench 202. The reshaping of the substrate material may continue until the buried trench 106*b* is formed, as shown, for example, in FIG. 5D.

Figure 5D:
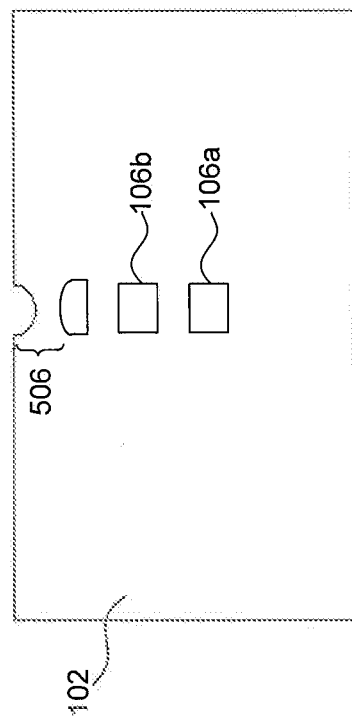

Another buried trench above the buried trench 106*b* may also be formed by closing the opening 204 of the trench 202 in a manner similar to the process explained in FIGS. 4A-C above, as shown, for example, in FIG. 5D. The reshaping of the substrate material may continue until the buried trench 106*c* is formed, as shown, for example, in FIG. 5E.

In an embodiment, hydrogen annealing is used to cause the substrate material to flow. In another embodiment, buried trenches 106 maybe empty of any solid material. The buried trenches 106 may, for example, contain air.

It should be understood that the various layers illustrated during the example fabrication process of IC 100*c* are not necessarily drawn to scale. In addition, the above description is meant to provide a general overview of select steps involved in forming IC 100*c* shown in FIG. 1C and that, in actual practice, more features and/or fabrication steps may be performed additionally or alternatively to that described herein to form IC 100*c*, as would be understood by one skilled in the art given the description herein.

Figure 6:
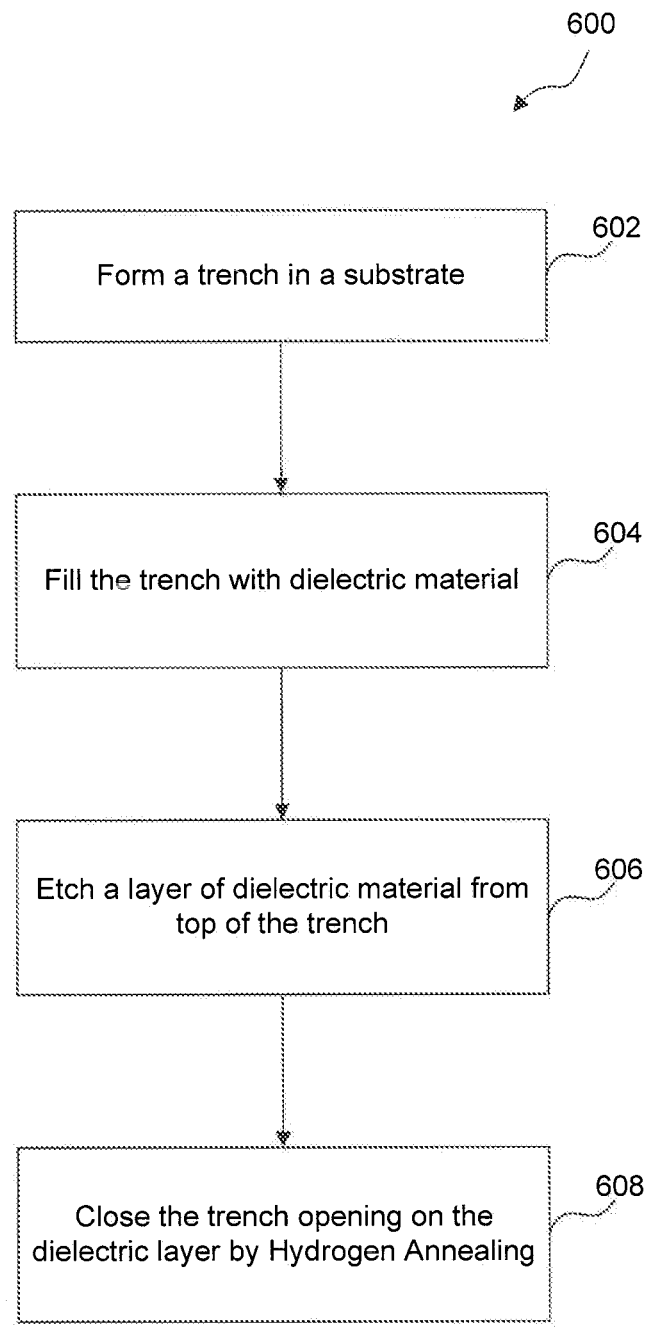
FIG. 6 illustrates a flowchart for a method of fabricating an IC, according to a first embodiment.

Example Steps for Fabricating an Integrated Circuit According to a First Embodiment FIG. 6 illustrates a flowchart for a method 600 of fabricating an IC, e.g., IC 100*a* shown in FIG. 1A, according to an embodiment. Solely for illustrative purposes, the steps illustrated in FIG. 6 will be described with reference to example fabrication process illustrated in FIGS. 2A-2E. It is to be appreciate not all steps may be required, nor occur in the order shown.

In step 602, trench 202 may be formed in the substrate 102, as shown in FIG. 2A, by a dry etch process such as, but not limited to, reactive ion etching (RIE) to remove the material of substrate 102, according to an embodiment.

In step 604, trench 202 may be filled by depositing a layer 206 of dielectric material such as silicon oxide or silicon nitride. The deposition of layer 206 may be performed using, for example, a CVD or an ALD process. In step 606 an etch-back process is used to remove a layer from all areas except for portion 208, as described above with reference to FIG. 2C.

In step 608 the open portion 204 of the trench is closed by causing the substrate material surrounding it to flow by, for example, Hydrogen annealing.

It should be noted that, although the above method description and related figures describe fabricating only one arrangement of buried trench 104 interposed between adjacent devices 101 for the sake of simplicity. However, as would be understood by a person of skilled in the art based on the description herein, the above steps may be applied to fabricate any number of such arrangements with devices and trenches similar to devices 101 and trench 104, respectively.

Those skilled in the relevant art(s) will recognize that the above method 600 may additionally or alternatively include any of the steps or sub-steps described above with respect to FIGS. 2A-2E, as well as any of their modifications. Further, the above description of the example method 600 should not be construed to limit the description of IC 100*a* described above.

Figure 7:
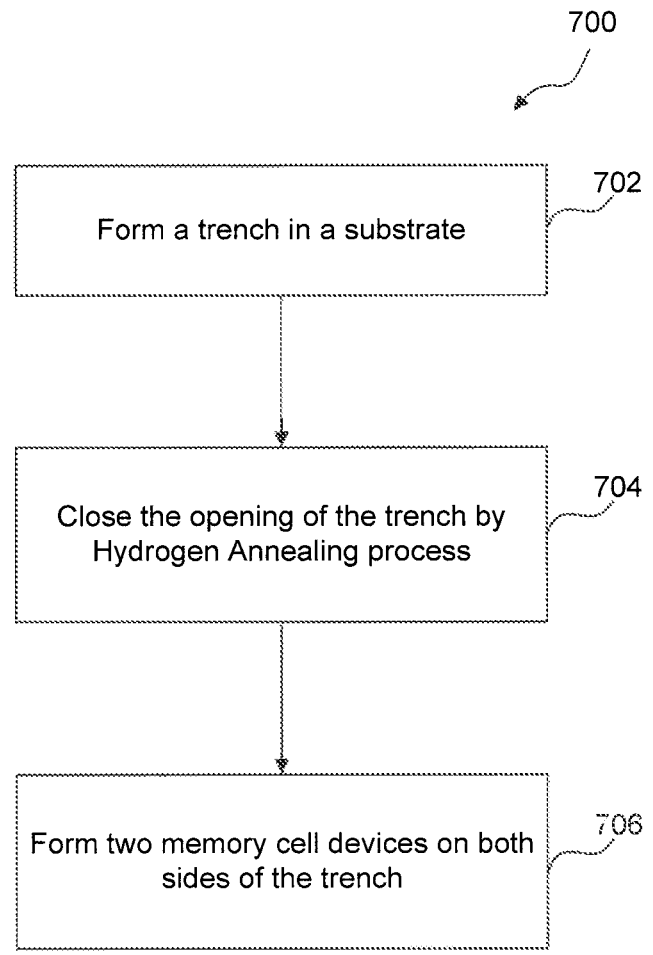
FIG. 7 illustrates a flowchart for a method of fabricating an IC, according to a second embodiment.

Example Steps for Fabricating an Integrated Circuit According to a Second Embodiment FIG. 7 illustrates a flowchart for a method 700 of fabricating an IC, e.g., IC 100*b* shown in FIG. 1B, according to an embodiment. Solely for illustrative purposes, the steps illustrated in FIG. 7 will be described with reference to example fabrication process illustrated in FIGS. 4A-4C. It is to be appreciate not all steps may be required, nor occur in the order shown.

In step 702, trench 202 may be formed in the substrate 102, as shown in FIG. 2, by a dry etch process such as, but not limited to, reactive ion etching (RIE) to remove the material of substrate 102, according to an embodiment. In step 704 the open end 204 of the trench is closed to form buried trench 105. Closing of the open end of the trench may be done by causing the substrate material surrounding it to flow, for example by Hydrogen annealing.

At step 706, memory cell devices 101 are formed on both sides of the trench 202.

It should be noted that, although the above method description and related figures describe fabricating only one arrangement of buried trench 104 interposed between adjacent devices 101 for the sake of simplicity. However, as would be understood by a person of skilled in the art based on the description herein, the above steps may be applied to fabricate any number of such arrangements with devices and trenches similar to devices 101 and trench 105, respectively.

Those skilled in the relevant art(s) will recognize that the above method 700 may additionally or alternatively include any of the steps or sub-steps described above with respect to FIG. 4A-4C, as well as any of their modifications. Further, the above description of the example method 700 should not be construed to limit the description of IC 100*b* described above.

It is to be appreciated that the Detailed Description section, and not the Summary and Abstract sections (if any), is intended to be used to interpret the claims. The Summary and Abstract sections (if any) may set forth one or more but not all embodiments of the present disclosure as contemplated by the inventor(s), and thus, are not intended to limit the present disclosure or the appended claims in any way.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

The breadth and scope of the present disclosure should not be limited by any of the above-described embodiments, but should be defined only in accordance with the following claims and their equivalents.

What is claimed is:

1. A method, comprising:
    forming a trench in a substrate, the trench having a closed end within the substrate and an open end adjacent a surface of the substrate;
    forming a seed layer in the trench before initiating a reshaping of portion of the substrate surrounding the open end of the trench;
    initiating the reshaping of portion of the substrate surrounding the open end of the trench;
    closing the open end of the trench with substrate material to form an isolation region within the substrate; and
    creating first and second devices on the surface of the substrate on opposite sides of the isolation region.

2. The method of claim 1, further comprising:
    depositing dielectric material in the trench such that the layer of dielectric material substantially fills the trench;
    removing the dielectric material from a top portion of the trench; and
    closing the open end of the trench such that the substrate material fills the top portion of the trench.

3. The method of claim 2, further comprising:
    forming a seed layer on the dielectric layer in the trench.

4. The method of claim 3, wherein the forming of the seed layer is before closing the open end of the trench and the seed layer comprises a material that helps smooth reshaping of the substrate material and closing of the trench opening.

5. The method of claim 3, wherein the seed layer comprises a same material as the substrate material.

6. The method of claim 2, further comprising:
    forming a seed layer on the dielectric layer in the trench and on the top surface of the substrate.

7. The method of claim 2, further comprising:
    forming a seed layer covering top of the dielectric layer, and covering every sidewall of the trench above the dielectric layer, and covering the top surface of the substrate.

8. The method of claim 1, wherein the isolation region comprises an air gap.

9. The method of claim 1, wherein:
    the initiating of the reshaping of the portion of the substrate is at more than one location along the trench; and
    the closing is of the trench at the more than one location to form more than one isolation regions, which are arranged vertically within the substrate.

10. The method of claim 1, further comprising using hydrogen annealing to cause the substrate material to flow.

11. The method of claim 10, wherein the hydrogen annealing comprises annealing in temperature range of approximately 600° C. to approximately 1150° C., and pressure range of approximately 0.1 Pa to approximately 100 kPa.

12. A method for isolating two devices formed on a substrate of an integrated circuit (IC), comprising:
    forming a trench in the substrate between the two devices;
    forming a seed layer in the trench before initiating a reshaping of portion of the substrate surrounding an open end of the trench;
    initiating the reshaping of portion of the substrate surrounding the open end of the trench; and
    closing the open end of the trench with substrate material, thereby forming an isolating region in the substrate.

13. The method of claim 12, further comprising:
    depositing dielectric material in the trench such that the layer of dielectric material substantially fills the trench;
    removing the dielectric material from a top portion of the trench; and
    closing the open end of the trench such that the substrate material fills the top portion of the trench.

14. The method of claim 13, further comprising:
    forming a seed layer on the dielectric layer in the trench.

15. The method of claim 14, wherein the forming of the seed layer is before closing the open end of the trench and the seed layer comprises a material that helps smooth reshaping of the substrate material and closing of the trench opening.

16. The method of claim 14, wherein the seed layer comprises a same material as the substrate material.

17. The method of claim 13, further comprising:
    forming a seed layer on the dielectric layer in the trench and on the top surface of the substrate.

18. The method of claim 13, further comprising:
    forming a seed layer covering top of the dielectric layer, and covering every sidewall of the trench above the dielectric layer, and covering the top surface of the substrate.

19. The method of claim 12, further comprising using hydrogen annealing to cause the substrate material to flow.

20. The method of claim 19, wherein the hydrogen annealing comprises annealing in temperature range of approximately 600° C. to approximately 1150° C., and pressure range of approximately 0.1 Pa to approximately 100 kPa.

* * * * *